United States Patent [19]

Ushiro

[11] Patent Number: 5,321,826
[45] Date of Patent: Jun. 14, 1994

[54] DISK CONTROL SYSTEM IN WHICH SPARE DISK AND MASTER DISKS ARE DYNAMICALLY EXCHANGED

[75] Inventor: Sotaro Ushiro, Tokyo, Japan

[73] Assignee: Kabushiki Kaisha Toshiba, Kawasaki, Japan

[21] Appl. No.: 799,291

[22] Filed: Nov. 27, 1991

[30] Foreign Application Priority Data

Nov. 30, 1990 [JP] Japan ................................. 2-340329

[51] Int. Cl.⁵ ............................................. G06F 13/10
[52] U.S. Cl. ...................................................... 395/425
[58] Field of Search ......................................... 395/425

[56] References Cited

U.S. PATENT DOCUMENTS 5,051,887 9/1991 Berger et al. ........................ 395/425
5,247,618 9/1993 Davis et al. ......................... 395/275

Primary Examiner—David L. Robertson
Attorney, Agent, or Firm—Finnegan, Henderson Farabow, Garrett & Dunner

[57] ABSTRACT

A magnetic disk control system includes a table for storing assignment information for assigning one of said first and second magnetic disk drives as a master disk for data I/O operations and the other as a spare disk for backing up said master disk, a copying section for executing data copy from the master disk to the spare disk, assignment information updating section for, when the data copying unit complete data copy from the master disk to the spare disk, exchanging the assignment information on the magnetic disk drive as a data copy source and the magnetic disk drive as a copy destination, and a operation check section for executing an operation check for maintenance for the disk drive newly assigned as the spare disk.

12 Claims, 6 Drawing Sheets

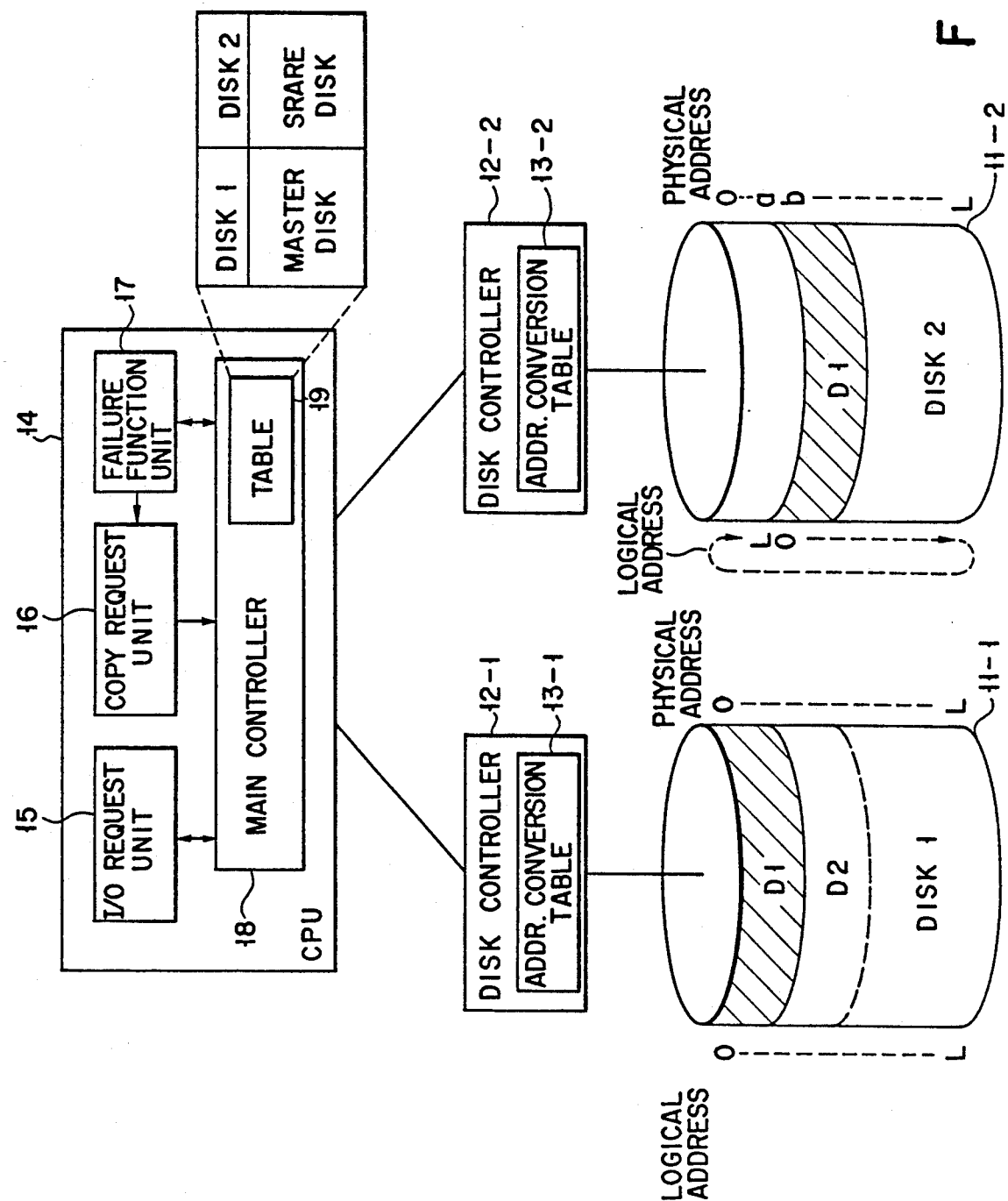

| LOGICAL ADDRESS | PHYSICAL ADDRESS |
|---|---|
| 0 | 0 |
| ⋮ | ⋮ |
| L | L |

FIG. 2A

| LOGICAL ADDRESS | PHYSICAL ADDRESS |
|---|---|
| L-1 | 0 |
| L | a |
| 0 | b |
| ⋮ | ⋮ |
| L-2 | L |

FIG. 2B

|  | DISK 1 | DISK 2 | DISK 3 | DISK 4 | ... | DISK n |
|---|---|---|---|---|---|---|
| ROTATION 0 | SPARE DISK | M1 | M2 | M3 | ---- | Mn-1 |
| ROTATION 1 | M1 | SPARE DISK | M2 | M3 | ---- | Mn-1 |
| ROTATION 2 | M1 | M2 | SPARE DISK | M3 | ---- | Mn-1 |
| ROTATION 3 | M1 | M2 | M3 | SPARE DISK | ---- | Mn-1 |
| ---- | ---- | ---- | ---- | ---- | ---- | ---- |
| ROTATION n-1 | M1 | M2 | M3 | M4 | ---- | SPARE DISK |

F I G. 5

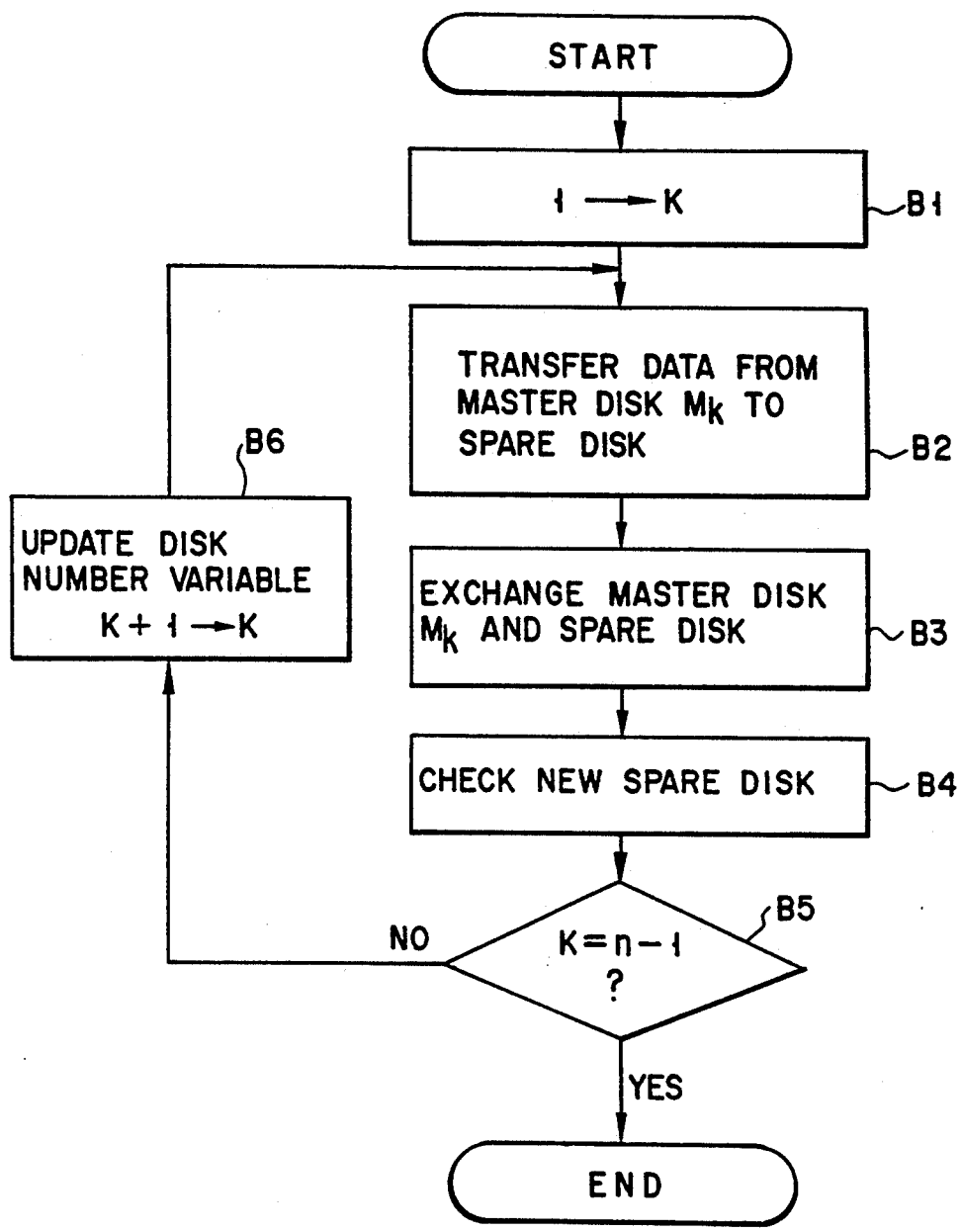
F I G. 6

DISK CONTROL SYSTEM IN WHICH SPARE DISK AND MASTER DISKS ARE DYNAMICALLY EXCHANGED

BACKGROUND OF THE INVENTION

1. Field of the Invention

The present invention relates to a disk control system and, more particularly, to a disk control system for controlling a plurality of magnetic disk drives.

2. Description of the Related Art

Generally, in a disk system including a plurality of magnetic disk drives, preventative maintenance for each disk drive is performed in order to ensure the reliability of an operation of the disk drive. That is, inspection of each disk drive or its operation check is performed periodically. Upon occurrence of a failure, recovery processing for the failure or parts replacement is executed. Execution of this preventative maintenance can prevent occurrence of an event such as, for example, a disk system in operation going down due to a failure.

In this preventative maintenance, a check work for the operation of a magnetic disk drive is performed by executing the following three failure countermeasure functions; i.e., a failure detection function, a failure recovery function, and a failure prevention function.

The failure detection function performs error detection and correction for data recorded on a magnetic recording medium of a magnetic disk drive by means of parity check, Hamming code check, or cyclic code check.

The failure recovery function performs appropriate processing for a detected malfunction to recover a normal state. For example, reformatting or the like of a magnetic disk drive corresponds to this function.

The failure prevention function detects a failure beforehand during an operation of a magnetic disk system. A patrol function (patrol seek/verify), for example is known as this type of failure prevention function. This patrol function periodically reads out data in sequence from magnetic disk drive independently of access by a user program and finds a failure before it happens, in accordance with the presence or absence of an error in the readout data. Information concerning, e.g. the location where a failure found by the patrol function took place, is sampled as error log information, and this error log information is used to carry out the work of preventative maintenance.

In executing the preventative maintenance work using the above failure detection, recovery, and prevention functions, it is a common practice to set a magnetic disk drive as an object of the maintenance in an inoperative state and to inhibit all I/O requests from user programs to the magnetic disk drive of interest.

This is so because when the recovery function, such as reformatting, for example, is to be performed in the preventative maintenance operation, it is necessary to save and store data in the magnetic disk drive of interest in another memory and to restore the saved data to the magnetic disk drive after reformatting. In this case, since neither data write nor read can be performed for that disk drive during reformatting, all I/O requests from user programs are inhibited.

Also, even while a disk drive is being used, if contention occurs between access by the patrol function and an I/O request from a user program, the I/O request from the user program is waited. This results in degradation in the I/O performance with respect to that disk drive.

As described above, in conventional systems, I/O requests from user programs must be sacrificed for the operation check while performing preventative maintenance for magnetic disk drives. As a result, the operating performance of the magnetic disk system is reduced.

Especially in a large-capacity magnetic disk system including a large number of magnetic disk drives, it is necessary to execute the operation check for preventative maintenance for all of the magnetic disk drives. The result is that a very long time is required for the preventative maintenance of the magnetic disk system. For this reason, the time during which the magnetic disk system is set in an inoperative state is prolonged, causing an increase in the number of I/O requests from user program whose acceptance is inhibited.

A failure caused by head crash also is known as a problem inherent in a magnetic disk drive of a magnetic disk system.

Head crash is a phenomenon in which a magnetic head and a magnetic recording medium mechanically collide against each other due to dust, and consequently the head or the recording medium is damaged.

A failure caused by head crash takes place because a magnetic disk drive adopts a CSS (contact-start-stop) system; that is, a magnetic head is slightly floated from a recording medium rotated at high speed. The floating position of the magnetic head is unbalanced by dust, and this causes mechanical contact between the magnetic head and the recording medium.

Especially when a magnetic head is kept located on a specific recording area (track) and is not moved to another area (this state is called a disk fixed position floating state), dust easily accumulates on the recording medium, allowing easy occurrence of head crash. For this reason, if only a particular address of a disk drive is accessed frequently, this disk fixed position floating state easily increases the possibility of head crash.

In order to prevent failure caused by such head crash, a means for, e.g., increasing dust removal efficiency by performing ventilation using an air filter is used. However, this countermeasure is in practice unsatisfactory when the disk fixed position floating described above is taken into consideration. Therefore, it is difficult to eliminate the danger of head crash.

SUMMARY OF THE INVENTION

It is an object of the present invention to provide a disk control system capable of performing sufficient preventative maintenance without sacrificing I/O requests from a host computer.

It is another object of the present invention to provide a disk control system capable of decreasing the probability of occurrence of a failure caused by head crash in each of a plurality of disk drives.

According to the present invention, there is provided a magnetic disk control system comprising a management table for storing assignment information for assigning one of the plurality of disk drives as a spare disk and the other disk drives as master disks; data copying means for copying data stored in a disk drive which is one of the disk drives assigned as master disks and is designated as an object of maintenance, to the disk drive assigned as the spare disk; information updating means for, when the data copying means completes data copy from the master disk to the spare disk, exchanging the assignment information on the disk drive as a data copy source and the disk drive as a data copy destination so that the disk drive as a data copy source is switched from the master disk to the spare disk and the disk drive as a data cop destination is switched from the spare disk to the master disk, and means for executing an operation check for maintenance for the disk drive newly assigned as the spare disk by the assignment information updating means.

In this disk control system, after data is copied from the master disk to the spare disk, the master disk is switched to the spare disk, and the spare disk is switched to the master disk. The operation check using failure countermeasure functions for performing failure detection, failure recovery, and failure prevention is executed for the disk drive switched to the spare disk, whereas data I/O processing is executed for the disk drive switched to the master disk. Therefore, preventative maintenance for a disk drive can be performed while accepting I/O requests.

In addition, according to the present invention, the master disk and the spare disk are switched with each other. Therefore, by updating a master disk as an object of switching, sequentially, between a plurality of master disks, the failure countermeasure function can be executed for each of the disk drives.

Furthermore, according to the present invention, not only the master disk and the spare disk are switched, but also data copy from the master disk to the spare disk is performed such that the physical location of data is changed between the new and old master disks.

For this reason, even if I/O requests for the same data are frequently generated, disks to be actually accessed are different, and the physical addresses of the data are different. Consequently, the above problem of disk fixed position floating can be avoided and the danger of a head crash is reduced, resulting in sufficient operating reliability.

Additional objects and advantages of the invention will be set forth in the description which follows, and in part will be obvious from the description, or may be learned by practice of the invention. The objects and advantages of the invention ma be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description give above and the detailed description of the preferred embodiment given below, serve to explain the principles of the invention.

FIG. 1 is a block diagram showing the arrangement of a disk control system according to an embodiment of the present invention;

FIGS. 2A is a view showing an example of the practical contents of an address conversion table corresponding to a master disk of the disk control system shown in FIG. 1;

FIG. 2B is a view showing an example of the practical contents of an address conversion table corresponding to a spare disk of the disk control system shown in FIG. 1;

FIG. 5 is a view showing changes in contents of an address conversion table provided in the system shown in FIG. 4; and FIG. 6 is a flow chart for explaining a switching operation between a master disk and a spare disk performed in the system shown in FIG. 4.

DETAILED DESCRIPTION OF THE PREFERRED EMBODIMENTS

Figure 3:
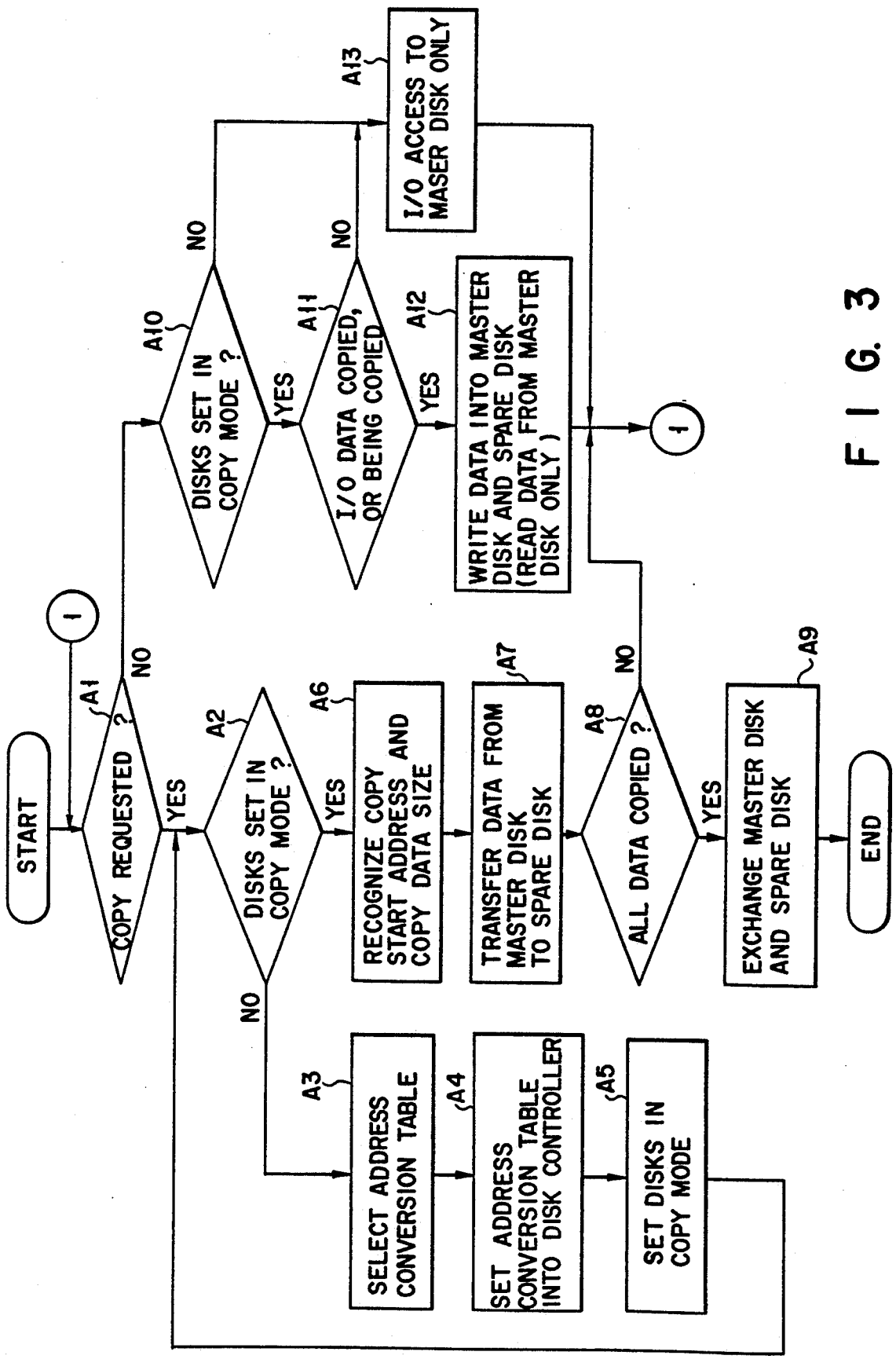
FIG. 3 is a flow chart for explaining the operation of the disk control system shown in FIG. 1.

FIG. 1 shows a disk control system according to an embodiment of the present invention. This disk control system comprises a plurality of magnetic disk drives and controls data input and output with respect to these magnetic disk drives. For the sake of simplicity, however, it is assumed, as the simplest example, that the system comprises two magnetic disk drives; one of the two magnetic disk drives is used as a master disk for data input and output, while the other magnetic disk drive is used as a spare disk for backing up the master disk.

As shown in FIG. 1, the disk control system of this embodiment includes first and second magnetic disk drives (DISK1 and DISK2) 11-1 and 11-2, first and second disk controllers 12-1 and 12-2, and a CPU 14.

Each of the magnetic disk drives (DISK1 and DISK2) 11-1 and 11-2 includes a disk-like magnetic recording medium, a magnetic head for performing data recording and reproduction, a rotating mechanism for the magnetic recording medium, a positioning mechanism for the magnetic head, and an electronic circuit for controlling these components, and both magnetic disk drives have the same memory capacity as each other.

Each of the disk controllers 12-1 and 12-2 execute data I/O operations for the corresponding one of the magnetic disk drives 11-1 and 11-2 under the control of the CPU 14.

The disk controller 12-1 is provided with an address conversion table 13-1. The address conversion table 13-1 defines a correspondence between a logical address for I/O operations given by the CPU 14 and a physical address in the magnetic disk drive 11-1 corresponding to the logical address. Likewise, the disk controller 12-2 is provided with an address conversion table 13-2. The address conversion table 13-2 defines a correspondence between a logical address for input and output operations given by the CPU 14 and a physical address in the magnetic disk drive 11-2 corresponding to the logical address.

When the magnetic disk drive 11-1 is used as the master disk and the magnetic disk drive 11-2 is used as the spare disk for the magnetic disk drive 11-1, the address conversion tables 13-1 and 13-2 are formed, for example, as shown in FIGS. 2A and 2B, respectively.

That is, address conversion information in the address conversion table 13-1 corresponding to the master disk is defined, as shown in FIG. 2A, such that the start address of the logical address is in agreement with the start address of the physical address in the magnetic disk drive 11-1. In the magnetic disk drive 11-1, therefore, the value "0" of the logical start address and the value "L" of the logical end address correspond to the value "0" of the physical start address and the value "L" of the physical end address, respectively.

As shown in FIG. 2B, on the other hand, address conversion information in the address conversion table 13-2 corresponding to the spare disk is defined such that the start address of the logical address is in agreement not with the start address value of the physical address in the magnetic disk drive 11-2, but with a value advanced by a predetermined amount from the start address value. In the magnetic disk drive 11-2, therefore, the value "0" of the logical start address and the value "L" of the logical end address correspond to physical address values "a" and "b", respectively.

The CPU 14 controls the entire disk control system having the above arrangement. The CPU 14 comprises an I/O request unit 15, a copy request unit 16, a failure function unit 17, and a main controller 18.

The I/O request unit 15 issues an I/O request with respect to the master disk to the main controller 18, in accordance with a user program.

The copy request unit 16 issues a data copy request with respect to the master disk to the main controller 18. This copy request is issued when, for example, the operation check is to be performed for a magnetic disk drive operating as the master disk. That is, in order to perform the operation check for the master disk, the failure function unit 17 supplies an execution request for functions (e.g., a patrol function and a reformatting function) for performing the failure countermeasure to the copy request unit 16, and the copy request unit 16 issues the copy request in response to the execution request.

This copy request command contains a copy start address for designating the start data of an object to be copied and length information for designating copy data size.

This copy request is also issued when occurrence of a failure is detected in a magnetic disk drive operating as the master disk. That is, when the failure function unit 17 detects an error in read data from the master disk, or a failure such as read disable, it supplies the execution request for functions for the failure countermeasure to the copy request unit 16. The copy request unit 16 issues the copy request in response to the execution request.

Commonly, it is necessary to copy all data stored in the master disk onto the spare disk. For this purpose, therefore, data transfer from the master disk to the spare disk is executed, in sequence, in units of blocks. In this case, a plurality of copy requests each having a predetermined copy data size and copy start address, and which increase in number sequentially according to the length of block data, are repeatedly issued.

In order to perform the preventative maintenance for the magnetic disk drives 11-1 and 11-2, the failure function unit 17 executes, in cooperation with the main controller 18, functions concerned with failure detection (e.g., check on I/O data using an error correction code, a cyclic code, or the like), failure recovery (e.g., reformatting), and failure prevention (patrol function). When the reformatting or the patrol function is to be executed for a magnetic disk drive operating as the master disk, the failure function unit 17 instructs the copy request unit 16 to issue the copy request.

The main controller 18 executes and controls, in co-operation with the disk controllers 12-1 and 12-2, the data I/O operation and the copy operation in accordance with the requests from the I/O request unit 15 and the copy request unit 16. The main controller 18 supplies a write command, a read command, and a logical address for data read/write to a disk controller corresponding to a disk to be accessed.

The main controller 18 is provided with a disk management table 19. The disk management table 19 registers assignment information for assigning one of the two magnetic disk drives 11-1 and 11-2 as the spare disk and the other as the master disk. When the magnetic disk drive 11-1 is assigned as the master disk and the magnetic disk drive 11-2 is assigned as the spare disk, the assignment information in the disk management table 19 indicates, as shown in FIG. 1, that the first magnetic disk drive (DISK1) 11-1 is the master disk and the second magnetic disk drive (DISK2) 11-2 is the spare disk.

Prior to executing the data I/O operation and the copy operation, the main controller 18 refers to the disk management table 19 and recognizes which of the two magnetic disk drives is assigned as the master disk and which of them is assigned as the spare disk.

When a normal data I/O operation is to be performed, the main controller 18 accesses only the magnetic disk drive 11-1 assigned as the master disk and does not access the magnetic disk drive 11-2 assigned as the spare disk. In order to perform a copy operation, the main controller 18 reads out data from the magnetic disk drive 11-1 assigned as the master disk and writes the readout data into the magnetic disk drive 11-2 assigned as the spare disk.

When this data copy is finished, the main controller 18 exchanges the assignment information in the disk management table between the two disk drives. That is, the magnetic disk drive (DISK1) 11-1 is changed from the master disk to the spare disk, and the magnetic disk drive (DISK2) 11-2 is changed from the spar disk to the master disk.

The magnetic disk drive (DISK2) 11-2 newly assigned as the master disk is used to execute the normal data I/O operation request by a user program. The magnetic disk drive (DISK1) 11-1 newly assigned as the spare disk is subjected to an operation check for the preventative maintenance performed by the failure function unit 17.

The operation of the disk control system shown in FIG. 1 will be described below with reference to the flow chart of FIG. 3.

When a host computer (not shown) issues an access request for a disk drive, the main controller 18 of the CPU 14 in the magnetic disk system first checks whether the access request is an I/O request from the I/O request unit 15 or a copy request from the copy request unit 16 (Step A1). If the access request is the copy request, the main controller 18 checks whether the disks have been set in a copy mode (Step A2). If the disks have not yet been set in the copy mode, the flow advances to Steps A3 to A5 to execute copy mode set processing.

In this copy mode set processing, the main controller 18 first determines the contents of the address conversion table 13-2 to be set in the disk controller 12-2 corresponding to the spare disk drive 11-2 (Step A3), and sets the determined contents in the disk controller 12-2.

In this case, the contents of the address conversion table 13-2 to be set in the spare disk controller 12-2 are set such that the start address of the logical address corresponds to a physical address having a value which is advanced by a predetermined amount from that in the disk drive 11-1 assigned as the master disk.

For example, as described above with reference to FIGS. 2A and 2B, when the allocation of the logical address in the magnetic disk drive 11-1 assigned as the master disk begins with the start address of the physical address, i.e., a physical address "0", the allocation of the logical address in the magnetic disk drive 11-2 assigned as the spare disk is started from a physical address value "b" which is advanced by a predetermine amount from the physical address "0".

Subsequently, the main controller 18 sets the disk controllers 12-1 and 12-2 in the copy mode (Step A5).

Thereafter, the main controller 18 recognizes in Step A2 that the disks have been set in copy mode and then recognizes a logical address value indicating a copy start address and a copy data size from the copy request supplied from the copy request unit 16 (Step A6). The main controller 18 issues a data read command to the disk controller 12-1 corresponding to the magnetic disk drive 11-1 assigned as the master disk, and a data write command to the disk controller 12-2 corresponding to the magnetic disk drive 11-2 assigned as the spare disk. As a result, data transfer is performed from the magnetic disk drive 11-1 to the magnetic disk drive 11-2 (Step A7).

In this case, although the read start logical address supplied to the disk controller 12-1 and the write start logical address supplied to the disk controller 12-2 have the same logical address value, physical addresses actually accessed on the disks are different.

For this reason, as indicated by hatched portions in FIG. 1, for example, block data D1 stored in a storage location designated by a physical address "0" in the magnetic disk drive 11-1 assigned as the master disk is written from a storage location designated by a physical address "b" in the spare disk drive 11-2.

Such data transfer in units of blocks from the magnetic disk drive 11-1 to the magnetic disk drive 11-2 is executed for all data in the magnetic disk drive 11-1 by repeatedly performing the processing from Steps A1 to A7.

When the main controller 18 recognizes that copy of all data has been finished (Step A8), it changes the assignment information in the disk management table 19, thereby switching the magnetic disk drive 11-1 from the master disk to the spare disk and the magnetic disk drive 11-2 from the spare disk to the master disk (step A9). The main controller 18 causes the failure function unit 17 to perform the operation check for preventative maintenance for the magnetic disk drive 11-1 newly switched to the spare disk. In this operation check, failure detection processing using a patrol function or a parity function is performed for all data in the magnetic disk drive 11-1. If a failure is detected, recovery processing such as reformatting is executed.

On the other hand, a normal I/O operation according to a user program is executed for the magnetic disk drive 11-2 newly switched to the master disk.

Thereafter, if the operation check is to be performed for the magnetic disk drive 11-2 newly assigned as the master disk, data in the magnetic disk drive 11-2 as the master disk is copied to the magnetic disk drive 11-1 as the spare disk. Subsequently, the magnetic disk drive 11-2 is switched from the master disk to the spare disk, and the magnetic disk drive 11-1 is switched from the spare disk to the master disk. Thereafter, the operation check is performed for the magnetic disk drive 11-2 switched to the spare disk.

If the main controller 18 determines in step A1 that the access request for the disk drive is an I/O request issued from the I/O request unit 15, the flow advances to Steps A10 to A13 to execute data I/O processing corresponding to the I/O request.

In the data I/O processing, the main controller 18 first checks whether the disk controllers 12-1 and 12-2 have been set in the copy mode, i.e., whether the I/O request is issued during data copy (Step A10).

If the I/O request is issued during data copy, the main controller 18 checks whether a logical address contained in the I/O request designates data which has been copied or is being copied in the master disk (Step A11).

If block data which has been copied in the master disk is designated as an object to be updated by the I/O request, is it necessary to ensure the consistency of the data between the master disk and the spare data and to ensure that the data is the latest. Therefore, updating of the block data must be performed for both the master disk and the spare disk. Similarly, if block data which is being copied in the master disk is designated as an object to be updated by the I/O request, it is necessary to ensure the consistency of the data and to ensure that the data is the latest Therefore, updating of that block data must be performed for both the master disk and the spare disk.

Suppose, for example, that the block data D1 is being copied in the copy mode, or that although the block data D1 has been copied, another block data as an object to be copied remains uncopied in the copy mode. In this case, if a logical address for designating the block data D1 is designated by an I/O request, in order to ensure the consistency of the data and to ensure that the data is the latest, the main controller 18 executes data write, i.e., updating of the data D1 for both of the magnetic disk drives 11-1 and 11-2 (Step A12).

In this case, if the I/O request is a read access, a data read operation is executed only for the magnetic disk drive 11-1 as the master disk, and no data read operation is executed for the magnetic disk drive 11-2 as the spare disk.

When data other than the block data which has been copied or is being copied, i.e., block data which remains uncopied is updated by the I/O request, the block data updated by the updating processing is transferred from the master disk to the spare disk by the subsequent copy processing. Therefore, when block data which remains uncopied is updated, it is possible to ensure the consistency of the data between the master disk and the spare disk and to ensure that the data is the latest without performing data updating for the spare disk.

Assume, for example, that the block data D1 has been copied but another block data as an object to be copied remains uncopied. In this case, if the block data which remains uncopied, e.g., block data D2 is designated as an access object by an I/O request, the main controller 18 immediately accepts the I/O request and executes data I/O access only for the magnetic disk drive 11-1 as the master disk (Step A13).

If the main controller 18 recognizes in Step A10 that an I/O request is issued while the disk controllers 12-1 and 12-2 have not yet been set in the copy mode, it immediately accepts the I/O request and executes data I/O access only for the magnetic disk drive 11-1 as the master disk (Step A13).

In the disk control system shown in FIG. 1, as described above, when the operation check is to be executed for the magnetic disk drive 11-1 operating as the master disk, data copy is performed from the magnetic disk drive 11-1 as the master disk to the magnetic disk drive 11-2 as the spare disk. When the data copy is finished, the assignments of the master disk and the spare disk are exchanged between the two magnetic disk drives 11-1 and 11-2. Thereafter, the functions for the operation check are executed for the magnetic disk drive 11-1 newly assigned as the spare disk, and a normal I/O request is then performed for the magnetic disk drive 11-2 newly assigned as the master disk.

For this reason, preventative maintenance for a desired magnetic disk drive can be performed while I/O requests for the master disk are accepted.

In addition, in the data copy from the master disk to the spare disk, the value of a copy start physical address in the spare disk is advanced by a predetermined value from the value of a copy start physical address in the master disk. Therefore, even if data is designated by some particular logical address, the physical storage location of the data is different between the new and old master disks. For this reason, even if I/O requests for the same data are frequently generated, a magnetic disk to be actually accessed and the physical address of the data are changed each time the master disk and the spare disk are exchanged. Therefore, since the problem of disk fixed position floating can be avoided, it is possible to reduce the danger of head crash and to realize sufficient operating reliability.

Figure 4:
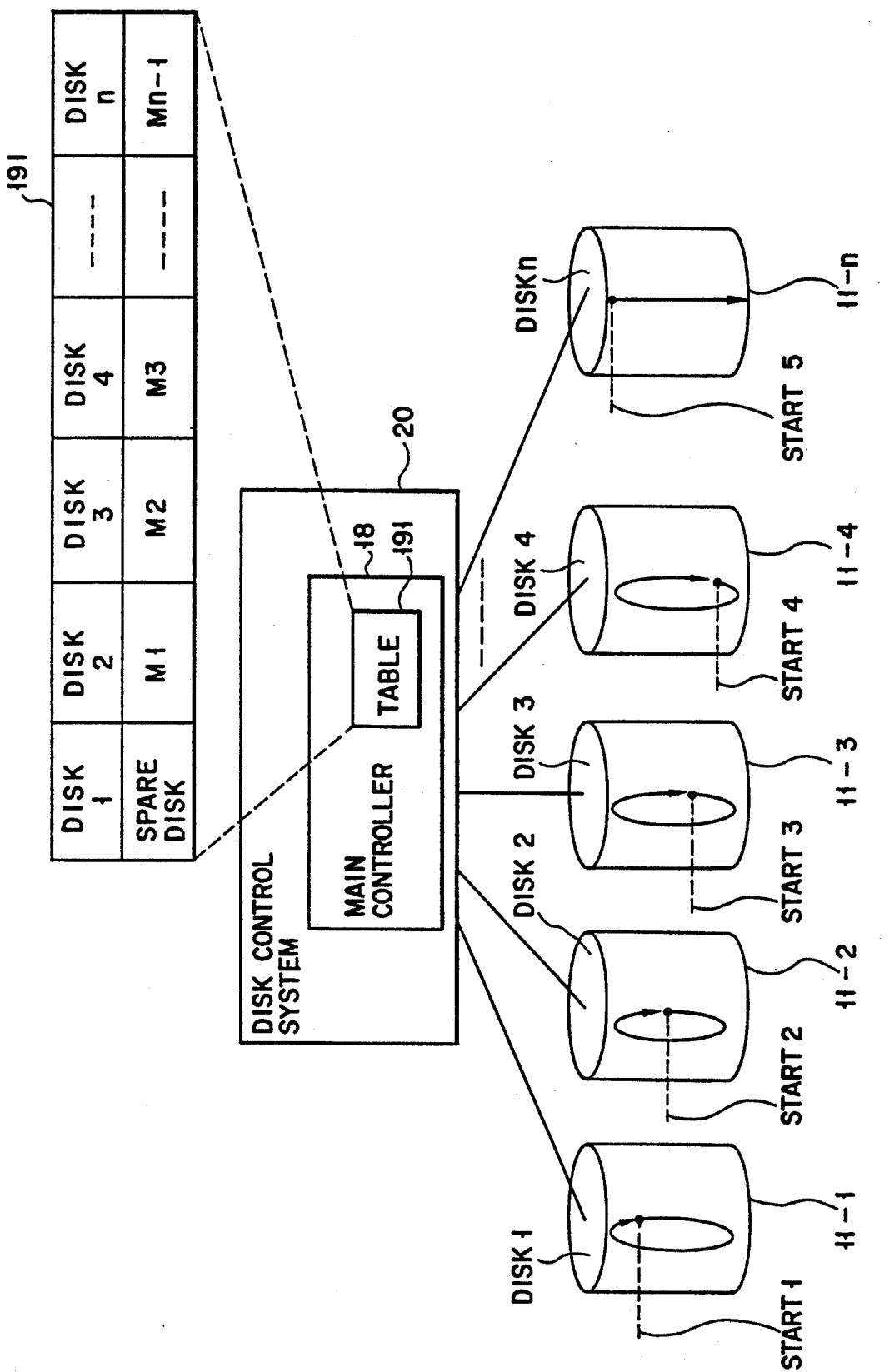
FIG. 4 is a block diagram showing a modification of the system arrangement in a case in which the disk control system shown in FIG. 1 controls a large number of disk drives.

Furthermore, the main controller 18 controls the contents (copy address and copy data size) of a copy request. Therefore, on the basis of the relationship between an I/O address and the copy address and copy data size, the main controller 18 can properly perform a data I/O operation corresponding to an I/O request even while the copy operation is being executed. This prevents degradation in the system performance due to the copy operation FIG. 4 shows a modification of the disk control system shown in FIG. 1. This disk control system comprises N ($N \geq 3$) magnetic disk drives 11-1 to 11-n. Of these N magnetic disk drives 11-1 to 11-n, N−1 magnetic disk drives are used as master disks for a data I/O operation, and the remaining one magnetic disk drive is used as a common spare disk for backing up the master disks.

Referring to FIG. 4, the CPU 14 and the disk controllers 12-1 and 12-2 together are represented by a control system 20; this control system 20 has the same arrangement as the control system composed of the CPU 14 and the disk controllers 12-1 and 12-2 shown in FIG. 1 except for the following point.

That is, the control system 20 of FIG. 4 in effect includes N disk controllers, for the N magnetic disk drives are objects to be controlled. Each disk controller has an arrangement identical to that of the disk controllers 12-1 and 12-2 shown in FIG. 1.

A main controller 18 of the control system 20 is provided with a disk management table 191 for indicating the assignment as a master disk or a spare disk for each of the N magnetic disk drives 11-1 to 11-n.

Assume, for example, that the magnetic disk drive 11-1 is to be assigned as the spare disk and the magnetic disk drives 11-2 to 11-n are to be assigned as the master disks. In this case, disk assignment information in the disk management table 191 states, as shown in FIG. 4, that the magnetic disk drive (DISK1) 11-1 is the spare disk, the magnetic disk drive (DISK2) 11-2 is the first master disk (M1), the magnetic disk drive (DISK3) 11-3 is the second master disk (M2), the magnetic disk drive (DISK4) 11-4 is the third master disk (M3), and the magnetic disk drive (DISKn) 11-n is the (n−1)th master disk ($M_{n-1}$).

In order to execute the operation check in sequence for the first to the (n−1)th master disks (M1 to $M_{n-1}$), the master disks (M1 to $M_{n-1}$) are sequentially exchanged with the spare disk. In this case, the exchange between the master disks and the spare disk is executed n−1 times.

FIG. 5 shows a relationship between the number of exchange times (rotation number) between the master disks and the spare disk and the contents of the disk assignment information in the disk management table 191.

In FIG. 5, it is assumed that the state in which the magnetic disk drive 11-1 is assigned as the spare disk and the magnetic disk drives 11-2 to 11-n are assigned as the first to the (n−1)th master disks (M1 to $M_{n-1}$), is the initial state (Rotation 0), and that from this state the operation check is executed for the magnetic disk drives 11-2 to 11-n in the order named.

In this case, as is apparent from FIG. 5, when checking the magnetic disk drive 11-2 as the first master disk (M1), the magnetic disk drive 11-2 as the first master disk (M1) is switched to the spare disk, and the magnetic disk drive 11-1 as the spare disk is switched to the first master disk (M1) (Rotation 1). Subsequently, when the magnetic disk drive 11-3 as the second master disk (M2) is to be checked, the magnetic disk drive 11-3 as the second master disk (M2) is switched to the spare disk, and the magnetic disk drive 11-2, which is switched to the spare disk in Rotation 1, is switched to the second master disk (M2) (Rotation 2). Likewise, exchange between the master disk which is the object of the operation check and the spare disk is performed in Rotations 3 to n−1.

A practical operation procedure for executing the operation check in the order of the first to the (n−1)th master disks (M1 to $M_{n-1}$) will be described below with reference to FIG. 6.

The control system 20 sets a value "1" as a variable K representing the number of a master disk (Step B1) and copies all data in a magnetic disk drive (in this case, the magnetic disk drive 11-2 as the first master disk M1) with a master disk number Mk to a magnetic disk drive (in this case, the magnetic disk drive 11-1) as the spare disk (Step B2). Thereafter, by altering the contents of the disk management table 191, the control system 20 assigns the magnetic disk drive (i.e., the magnetic disk drive 11-2) of the master disk number Mk, as the data copy source, as a new spare disk and assigns the magnetic disk drive as the data copy destination, which has been used as the spare disk, as a new master disk with the master disk number Mk (Step B3).

The control system 20 executes the operation check for preventative maintenance for the magnetic disk drive (i.e., the magnetic disk drive 11-2) newly assigned as the spare disk (Step B4). Thereafter, the control system 20 checks whether the value of the variable K has reached "n−1" (Step B5).

If the value of the variable K is smaller than "n−1", the control system 20 increments the variable K indicating the master disk number by one (Step B6), and the flow advances to the processing of Steps B2 to B4.

In Steps B2 to B4, the control system 20 copies all data of a magnetic disk drive (in this case, the magnetic disk drive 11-3 as the second master disk M2) with the master disk number Mk designated by the variable K which is changed by the increment to the magnetic disk drive (in this case, the magnetic disk drive 11-2) as the current spare disk (Step B2). Thereafter, by altering the contents of the disk management table 191, the control system 20 assigns the magnetic disk drive (i.e., the magnetic disk drive 11-3) of the master disk number Mk as the data copy source as a new spare disk and assigns the magnetic disk drive (i.e., the magnetic disk drive 11-2) as the data copy destination, which has been used as the spare disk, as a new master disk with the master disk number Mk (Step B3)

The control system 20 executes the operation check for preventative maintenance for the magnetic disk drive (i.e., the magnetic disk drive 11-3) newly assigned as the spare disk (Step B4). Thereafter, the control system 20 checks whether the value of the variable K has reached "n−1" (Step B5).

In this manner, the control system 20 repeatedly executes the processing of Steps B2 to B4 while updating the master disk number Mk until it recognizes in Step S5 that the value of the variable K has reached "n−1".

As a result, the spare disk is assigned in sequence to the N magnetic disk drives 11-l to 11-n, and the operation check is executed for a magnetic disk drive newly assigned as the spare disk. Therefore, all of the N magnetic disk drives 11-l to 11-n can be subjected to the operation check while N−1 master disks are constantly maintained in an operative state.

In addition, when the operation check is finished for a magnetic disk drive switched to the spare disk, that disk drive is set in an inoperative state until a data copy request is issued. In a magnetic disk drive in this inoperative state, the magnetic head of the drive is not floated by the CSS system but in contact with or retracted to a predetermined location (a specific area on a recording medium or a predetermined lock mechanism outside the range of the recording medium). Therefore, even if various shocks are applied to the magnetic disk drive, collision between the magnetic head and the recording medium will not occur.

For this reason, by assigning the spare disk in sequence to the N magnetic disk drives 11-1 to 11-n, all of the magnetic disk drives 11-1 to 11-n ca be set in the inoperative state sequentially. This equally improves the reliability of the CSS system of each of the magnetic disk drives 11-1 to 11-n Furthermore, the operation of the disk control system shown in FIG. 4 is similar to that of FIG. 1; in transferring data from the master disk to the spare disk, the value of the copy start physical address in the spare disk is set to a value advanced by a predetermined amount from the value of the copy start physical address in the master disk. Therefore, when the spare disk is assigned in sequence to the N magnetic disk drives 11-l to 11-n, the value of the copy start physical address of each of the magnetic disk drives 11-l to 11-n when assigned as the spare disk is changed sequentially as shown in FIG. 4.

For this reason, the physical location of data is different between new and old master disks even if the data is designated by a certain particular logical address. Therefore, even if I/O requests for the same data are frequently generated, the magnetic disk to be actually accessed and the physical address of the data are changed upon every exchange between the master disk and the spare disk. Consequently, the problem of disk fixed position floating can be avoided, and this reduces the danger of head crash and thereby realizes improved operating reliability.

In particular, when the exchange between the spare disk and the master disk is repeated several rotations, a plurality of master disk numbers are assigned to any of the magnetic disk drives. Therefore, data designated by some particular logical address is shifted among a plurality of magnetic disk drives. For this reason, even if I/O requests for the same data are frequently generated, the magnetic disk drive to be actually accessed is changed sequentially. This efficiently prevents the problem of head crash caused by fixed position floating.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A magnetic disk control system which includes a plurality of disk drives and controls data read and write operations for said disk drives in accordance with I/O requests, comprising:

memory means for storing assignment information for assigning one of said plurality of disk drives as a spare disk and the other disk drives as master disks;

data copying means for copying data stored in a disk drive, which is one of said disk drives assigned as the master disks and is designated as an object of maintenance, to said disk drive assigned as the spare disk;

information updating means for, when said data copying means completes data copy from said master disk to said spare disk, exchanging the assignment information on said disk drive as a data copy source and said disk drive as a data copy destination so that said disk drive as a data copy source is switched from the master disk to the spare disk and said disk drive as a data copy destination is switched from the spare disk to the master disk; and means for executing an operation check for maintenance for said disk drive newly assigned as the spare disk by said assignment information updating means, wherein said data copying means includes means for changing a copy start address in said disk drive as a data copy destination by a predetermined amount from a copy start address in said disk drive as a data copy source so that a physical storage location of the copied data is different between said disk drive as a data copy source and said disk drive as a data copy destination.

2. A system according to claim 1, further comprising mode setting means for setting said disk drive designated as an object of maintenance and said disk drive assigned as the spare disk in a copy mode for executing data copy performed by said data copying means.

3. A system according to claim 2, wherein said mode setting means includes means for setting in sequence all of said disk drives assigned as the master disks in the copy mode so that the operation check is performed for all of said disk drives.

4. A system according to claim 2, wherein said more setting means includes failure detecting means for detecting the occurrence of a failure in each of said disk drives assigned as the master disks, and means for setting a master disk, in which occurrence of a failure is detected by said failure detecting means, in the copy mode.

5. A system according to claim 1, further comprising:
mode setting means for setting said disk drive as an object of maintenance and said disk drive assigned as the spare disk in a copy mode for executing data copy performed by said data copying means;
detecting means for, when a data I/O request for said disk drive as a data copy source is issued during a set period of the copy mode, detecting whether data designated as an object to be updated by the data I/O request has been copied in said disk drive as a data copy destination; and
means for, when said detecting means detects that the data to be updated has been copied, executing data updating corresponding to the data I/O request for both of said disk drive as a data copy source and said disk drive as a data copy destination.

6. A magnetic disk control system which includes first and second magnetic disk drives and controls data read and write operations for said magnetic disk drives in accordance with I/O requests, comprising:
assignment means for assigning one of said first and second magnetic disk drives as a master disk for data I/O operations and the other as a spare disk for backing up said master disk;
data copying means for executing data copy from said magnetic disk drive assigned as the master disk to said magnetic disk drive assigned as the spare disk;
assignment updating means for, when said data copying means complete data copy from said master disk to said spare disk, exchanging the assignment information on said magnetic disk drive as a data copy source and said magnetic disk drive as a copy destination so that said magnetic disk drive as a data copy source is switched from the master disk to the spare disk and said magnetic disk drive as a data copy destination is switched from the spare disk to the master disk; and
means for executing an operation check for maintenance for said disk drive newly assigned as the spare disk by said assignment updating means,
wherein said data copying means includes means for changing a copy start address in said disk drive as a data copy destination by a predetermined amount from a copy start address in said disk drive as a data copy source so that a physical storage location of the copied data is different between said disk drive as a data copy source and said disk drive as a data copy destination.

7. A system according to claim 6, further comprising failure detecting means for detecting the occurrence of a failure in said disk derive assigned as the master disk, wherein said data copying means executes data copy from said master disk to said spare disk when said failure detecting means detects occurrence of a failure in said master disk.

8. A system according to claim 6, further comprising:
detecting means for, when a data I/O request for said master disk is issued during a copy execution period of said data copying means, detecting whether data designated as an object to be updated by the data I/O request has been copied in said spare disk; and
means for, when said detecting means detects that the data to be updated has been copied, executing data updating corresponding to the data I/O request for both of said master disk and said spare disk.

9. A method of assigning a plurality of disk drives as master disks for data I/O operations and a spare disk for backing up said master disk in a magnetic disk control system which includes said plurality of disk drives and controls data read and write operations for said disk drives in accordance with I/O requests, comprising the steps of:
(A) assigning a predetermined one of said plurality of disk drives as a spare disk and a plurality of other disk drives as master disks;
(B) selecting one master disk from said plurality of disk drives assigned as the master disks;
(C) copying data stored in the selected master disk to said disk drive assigned as the spare disk;
(D) when data copy from said master disk to said spare disk is completed, switching said disk drive as a data copy source from the master disk to the spare disk and said disk drive as a data copy destination from the spare disk to the master disk; and
(E) repeating the steps (B) to (D) so that said plurality of disk drives assigned as the master disks are assigned in sequence as the spare disk,
wherein the step (C) includes the substep (a) of changing a copy start address in said disk drive as a data copy destination by a predetermined amount from a copy start address in said disk drive as a data copy source so that a physical storage location of the copied data is different between said disk drive as a data copy source and said disk drive as a data copy destination.

10. A method according to claim 9, further comprising the step (F) of executing an operation check for maintenance for a disk drive newly assigned as the spare disk.

11. A disk control system for controlling a plurality of master disk drives and a spare disk drive for backup storage with respect to the master disk drives and performing a data read/write operation for the master disk drives in response to I/O requests, said system comprising:
means for selecting one master disk drive from among all the master disk drives as a disk drive to be maintained, said selection being performed for all the master disk drives in a predetermined order so as to verify the accuracy of their drivability; and
means for executing a disk rotation each time one master disk is selected as a disk to be maintained, said disk rotation-executing means including:
means for copying data stored in said selected master disk drive to said spare disk drive;
means for changing said master disk drive as a data copy source to a new spare disk drive and changing said spare disk drive as a data copy destination to a new master disk drive in response to the termination of the copying by said data copying means; and
means for executing a drivability check to verify the accuracy of the drivability of said new spare disk in a maintenance operation.

12. A system according to claim 11, wherein said data copying means includes means for changing a copy start address in said spare disk drive as a data copy destination by a predetermined amount from a copy start address in said disk drive as a data copy source so that a physical storage location of the copied data is different between said master disk drive as a data copy source and said spare disk drive as a data copy destination.

* * * * *

UNITED STATES PATENT AND TRADEMARK OFFICE
CERTIFICATE OF CORRECTION

PATENT NO. : 5,321,826
DATED : June 14, 1994
INVENTOR(S) : Sotaro USHIRO

It is certified that error appears in the above-indentified patent and that said Letters Patent is hereby corrected as shown below:

Claim 4, column 12, line 66, change "more" to --mode--.

Claim 7, column 13, line 55 change "derive" to --drive--.

Signed and Sealed this

Twenty-eight Day of March, 1995

Attest:

BRUCE LEHMAN

*Attesting Officer*  *Commissioner of Patents and Trademarks*